United States Patent [19]

Mawhinney

[11] 4,063,188
[45] Dec. 13, 1977

[54] INJECTION-LOCKED VOLTAGE CONTROLLED OSCILLATORS

[75] Inventor: Daniel David Mawhinney, Livingston, N.J.

[73] Assignee: RCA Corporation, New York, N.Y.

[21] Appl. No.: 668,907

[22] Filed: Mar. 22, 1976

[51] Int. Cl.² .......................... H03B 3/04; H03B 3/06
[52] U.S. Cl. ........................................ 331/11; 331/14; 331/18
[58] Field of Search ........................................ 331/9–11, 331/14, 18, 25, 1 R

[56] References Cited

U.S. PATENT DOCUMENTS

| 3,074,027 | 1/1963 | Rout | 331/10 X |
| 3,281,710 | 10/1966 | Hoover et al. | 331/9 X |
| 3,534,284 | 10/1970 | Beurrier | 331/10 |

Primary Examiner—Siegfried H. Grimm
Attorney, Agent, or Firm—Robert M. Rodrick; Joseph D. Lazar; H. Christoffersen

[57] ABSTRACT

An improved frequency memory system of the type using a voltage controlled oscillator is described. Incoming RF signals are power divided with a first power divided portion applied to a frequency discriminator where a voltage level signal indicative of frequency is derived. This voltage level signal is shaped and applied to the volage controlled oscillator wherein the oscillator is broadly tuned to the incoming frequency. A remaining portion of the power divided signal is applied directly to the RF circuit portion of the VCO oscillator to injection lock the VCO oscillator to the incoming signal.

6 Claims, 1 Drawing Figure

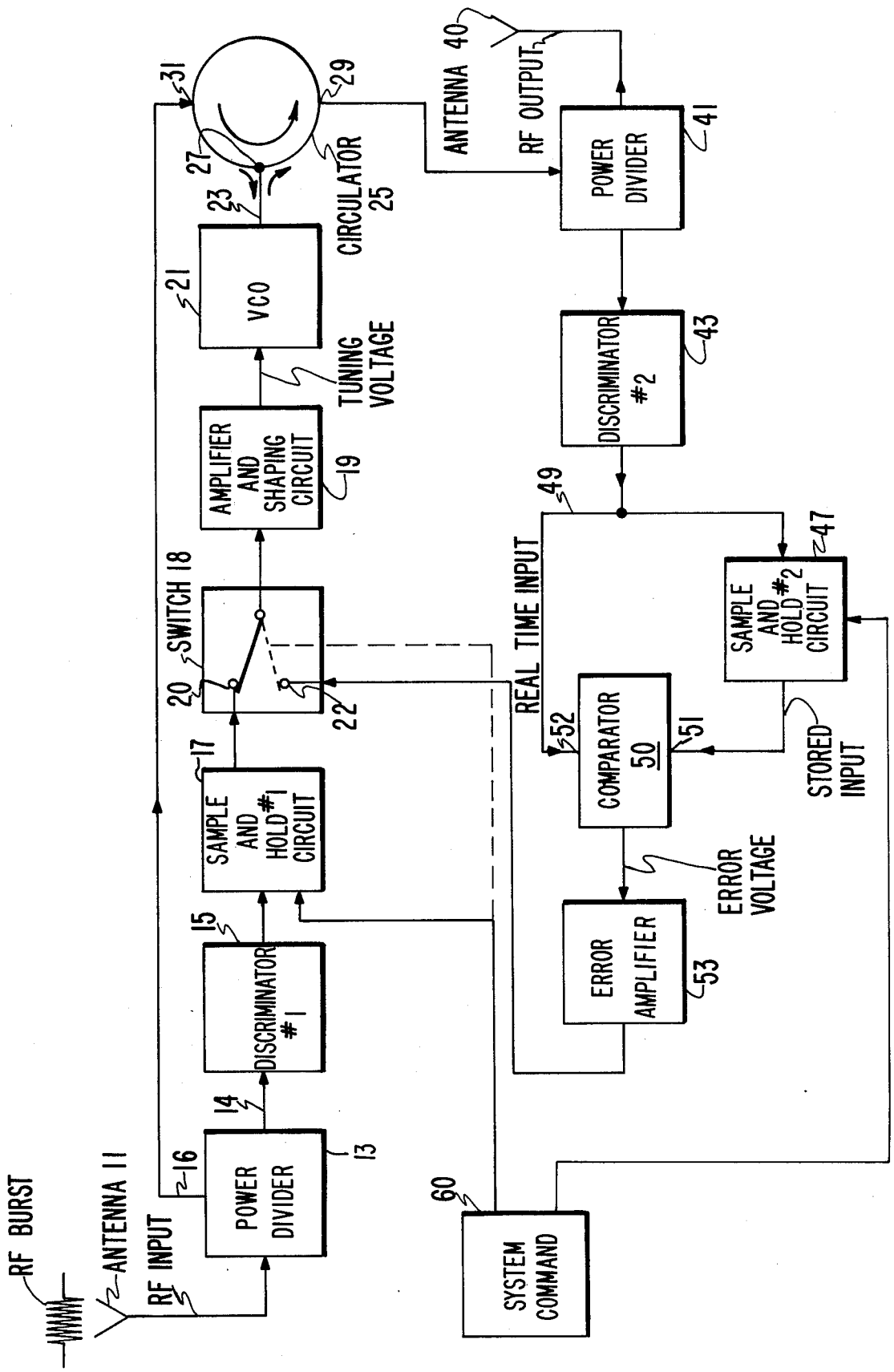

INJECTION-LOCKED VOLTAGE CONTROLLED OSCILLATORS

The Government has rights in this invention pursuant to Contract No. N00039-74-C-0227 awarded by Department of the Navy.

BACKGROUND OF INVENTION

This invention relates to voltage controlled oscillator (VCO) systems and more particularly to VCO systems used in frequency memory systems.

There are presently in use several types of electronic systems whose function is to provide a continuous wave output at the same frequency as the received signal where the received signal is a short duration RF burst such as from a radar. These systems sometimes referred to as frequency memory systems must be capable of tuning to a given frequency within a fairly broad range of frequencies rapidly and accurately. One commonly used system employs a microwave delay line and a broadband amplifier, such as a traveling wave tube, in which the incoming RF burst signal is recirculated many times to produce a practically continuous output. Another approach is the use of a set-on voltage controlled oscillator (VCO) in a system where a discriminator produces a voltage related to the frequency of the incoming signal, a sample and hold circuit is used to store this voltage (memory), and a VCO is tuned by this stored voltage. The accuracy of this system is determined by the discriminator and the VCO transfer characteristics and the memory time is limited by the sample-and-hold circuit storage time and the VCO drift. In the usual VCO system, the discriminator output is amplified and shaped so as to match the discriminator to that of the VCO tuning curve and to tune the VCO to the same frequency as the incoming signal. The accuracy of the set-on voltage to tune the VCO is limited by the calibration of the discriminator and the VCO and the changes in the operating characteristics of the discriminator and the VCO caused by variation in ambient temperatures and power supplies.

In conventional set-on VCO memory systems, the incoming signal is discriminated and the resulting output voltage is stored in the memory such as the sample and hold circuit. Because the discriminator calibration is limited in accuracy and resolution, the stored voltage is inaccurate to some degree. The problem is compounded by the fact that the incoming signal will be varying in amplitude unless major limiting and leveling accessories are added to the system. Furthermore, additional error is produced by drift or instability of the VCO after the stored output voltage is applied.

BRIEF DESCRIPTION OF INVENTION

Briefly, a fast and accurate system is described for generating an output signal approximately the same frequency as a received input frequency. The system includes a voltage controlled oscillator (VCO) and means including a discriminator responsive to the frequency of the incoming signal for providing a voltage to the VCO to tune the oscillator to the incoming signal frequency. The improvement in the VCO system is that the incoming signal is power divided with only a first power divided portion of the signal used to generate the voltage that tunes the VCO in a conventional way and the remaining portion of the power divided signal being coupled directly to the RF portion of the VCO oscillator to injection lock the VCO oscillator.

DETAILED DESCRIPTION OF A PREFERRED EMBODIMENT

A more detailed description follows in conjunction with the single FIGURE which is a block diagram of the system according to one preferred embodiment of the present invention.

Referring to the FIGURE, radio frequency (RF) burst signals at microwave frequencies for example are picked up at antenna 11 and are coupled to power divider 13. The power divider 13 may be a 3 db hybrid coupler. One half of the power is coupled via lead 14 to discriminator 15 and one-half of the power is coupled to lead 16. At discrimintor 15, the RF signals are discriminated and detected to provide an output voltage dependent on frequency of the incoming RF signal. The voltage may be stored in a memory such as a sample and hold circuit 17. The voltage signal from the sample and hold circuit 17 is coupled via terminal 20 of switch 18 to an amplifier and shaping circuit 19. The output of amplifier and shaping circuit 19 is coupled to voltage controlled oscillator (VCO) 21. The amplifier and shaping circuit 17 provides a voltage which matches the VCO oscillator 21 tuning curve to tune the VCO oscillator 21 to approximately the same frequency as the incoming signal. The output from VCO oscillator 21 is coupled via an RF transmission line 23 to port 27 of a three port microwave circulator 25. The output from the circulator 25 is coupled via port 29 and power divider 41 to antenna 40. The power divided signal on lead 16 of divider 13 is coupled to port 31 of circulator 25. This RF signal at port 31 is coupled to the RF portion of the VCO oscillator 21 via port 27 and the RF output transmission line 23. This RF signal coupled to the RF portion of the voltage controlled oscillator 21 causes injection locking of the VCO signal to the incoming RF signal. The VCO oscillator 21 is locked exactly on the same frequency as the incoming signal when the tuning voltage causes the VCO to be within the locking range.

The sample and hold circuit 17 can continue to provide the proper VCO tuning voltage after cessation of the input RF burst signal by providing this voltage from a memory in the sample and hold circuit 17. A signal from system command 60 can either energize or deenergize this memory.

A portion of the output signal to the antenna 40 is coupled via power divider 41 to a second discriminator 43. Power divider 41 may be a coupler as described by A. Schwarzmann in U.S. Pat. No. 3,742,392. At the second discriminator 43, the RF signals are discriminated and detected to provide an output voltage that is a function of frequency. This voltage matches the tuning curve of VCO oscillator 21. This output voltage from the discriminator is coupled over a first path via a second sample and hold circuit 47 to terminal 51 of comparator 50 and over a second path 49 to terminal 52 of comparator 50. At comparator 50 the real time output of the second discriminator 43 at terminal 52 is compared with the reference voltage from the sample and hold circuit 47 at terminal 51 and the resultant error voltage is applied thru error amplifier 53 to terminal 22 of switch 18. When the system command 60 determines that the input pulse burst has been received long enough (100 nanoseconds for example) for the VCO to be accurately locked to the proper frequency or that the burst has ended, a signal from system command 60 causes switch 18 to change state and to disconnect sample and hold circuit 17 at terminal 20 and to connect the output from error amplifier 53 via terminal 22 to amplifier and shaping circuit 19. Also, this signal from system command 60 de-energizes sample and hold circuit 17. Error amplifier 53 amplifies the error voltage in the proper polarity such that the voltage applied through the amplifier and shaping circuit 19 is such as to cause the voltage controlled oscillator 21 to change frequency in a direction such that the error voltage is adjusted towards zero. For example, if a positive increase in voltage level causes a rise in frequency at the VCO and the error voltage indicated a downward movement in frequency, a positive signal is coupled to VCO 21. System 60 could include a timer responsive to the detected presence of a signal at discriminator 15 for providing switching signals 100 nanoseconds after the detection of a signal at discriminator 15 and de-energizing signals a fixed time period after that.

This feed system described above eliminates discriminator error, the VCO tuning calibration and drift errors and the effect of incident power level variations on the accuracy of the memory.

What is claimed is:

1. A system for generating an output RF signal at the same frequency as a received RF input signal comprising:

first means responsive to said input signal for power dividing said input signal to provide separate first and second power divided signals,
   a voltage controlled RF oscillator,
   second means including a discriminator coupled to said oscillator and responsive to said first power divided signals for providing a control voltage related to the frequency of an input signal to said voltge controlled oscillator whereby said oscillator is broadly tuned toward the frequency of said input signal,
   said second means further including a sample and hold circuit coupled to the output of said discriminator for storing the control voltage provided therefrom, and
   third means for coupling said second power divided signals directly to the RF portion of said voltage controlled oscillator in a manner to cause injection locking of said oscillator whereby said oscillator is locked exactly on the frequency of the said input signal when the control voltage causes said oscillator to be within the locking range.

2. The combination of claim 1 wherein said first means includes a 3 db power divider.

3. The combination of claim 1 wherein said third means includes a circulator coupled at a first port to said power divider, at a second port to the RF output circuit of said voltage controlled oscillator and at a third port to an output circuit of said system.

4. The combination of claim 1 including fourth means including a discriminator coupled to the output of said voltage controlled oscillator for providing a second voltage related to the outcoming frequency from said voltage controlled oscillator and fifth means coupled to said fourth means for selectively applying a second control signal related to said second voltage to said voltage controlled oscillator.

5. The combination of claim 5 wherein said means for selectively applying said second control signal includes storing means for storing the output from said fourth means and comparator means coupled to said storing means and fourth means for subtracting the stored signal voltage from the real time voltage from said fourth means.

6. The combination of claim 1 including fourth means including a second discriminator coupled to the output of said voltage controlled oscillator for storing a second control voltage related to the outcoming frequency from said injection locked voltage controlled oscillator and fifth means for coupling only said second control voltage to said voltage controlled oscillator a time period after receiving said input signal.

* * * * *